US011145735B2

(12) United States Patent
Duval et al.

(10) Patent No.: US 11,145,735 B2
(45) Date of Patent: Oct. 12, 2021

(54) OHMIC ALLOY CONTACT REGION SEALING LAYER

(71) Applicant: Raytheon Company, Waltham, MA (US)

(72) Inventors: Paul J. Duval, Lexington, MA (US); John P. Bettencourt, Boxford, MA (US); James W. McClymonds, Waltham, MA (US); Paul M. Alcorn, Groton, MA (US); Philip C. Balas, II, Reading, MA (US); Michael S. Davis, Ipswich, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/599,650

(22) Filed: Oct. 11, 2019

(65) Prior Publication Data
US 2021/0111263 A1 Apr. 15, 2021

(51) Int. Cl.
H01L 29/45 (2006.01)
H01L 21/283 (2006.01)
H01L 23/31 (2006.01)

(52) U.S. Cl.
CPC .......... H01L 29/452 (2013.01); H01L 21/283 (2013.01); H01L 23/3157 (2013.01)

(58) Field of Classification Search
CPC . H01L 29/452; H01L 21/283; H01L 23/3157; H01L 29/42316; H01L 29/20; H01L 29/66871; H01L 29/8128
USPC .......................................................... 257/43
See application file for complete search history.

(56) References Cited

U.S. PATENT DOCUMENTS

| 4,695,869 | A | | 9/1987 | Inoue et al. |
| 5,063,174 | A | | 11/1991 | Beyea et al. |
| 5,330,585 | A | | 7/1994 | Chang et al. |
| 5,459,107 | A | * | 10/1995 | Palmour ............... H01L 21/045 257/E21.055 |
| 5,639,677 | A | | 6/1997 | Lee et al. |
| 5,760,418 | A | | 6/1998 | Lee et al. |
| 6,005,267 | A | * | 12/1999 | Griffin ................ H01L 29/7832 257/270 |
| 6,316,793 | B1 | | 11/2001 | Sheppard et al. |

(Continued)

FOREIGN PATENT DOCUMENTS

DE   11 2005 001 179 B4   2/2018
EP       1 630 860 A2      3/2006

(Continued)

OTHER PUBLICATIONS

A.G. Baca, F. Ren, J,C. Zolper, R.D. Briggs, S.J. Pearton, A survey of ohmic contacts to III-V compound semiconductors, Thin Solid Films 308-309, 1997, pp. 599-606, 8 pages.

(Continued)

Primary Examiner — David Vu
(74) Attorney, Agent, or Firm — Daly, Crowley, Mofford & Durkee, LLP

(57) ABSTRACT

Forming an ohmic contact sealing layer disposed at an intersection between a sidewall of an ohmic contact and a surface of a semiconductor; forming an ohmic contact sealing layer on the intersection between a sidewall of the ohmic contact and the surface of the semiconductor; and subjecting the semiconductor with the ohmic contact to a chemical etchant.

13 Claims, 16 Drawing Sheets

(56) References Cited

U.S. PATENT DOCUMENTS

| | | |
|---|---|---|
| 6,391,696 B1 | 5/2002 | Onda |
| 8,916,459 B2 | 12/2014 | Takahashi et al. |
| 2009/0078966 A1 | 3/2009 | Asai et al. |
| 2014/0061659 A1 | 3/2014 | Teplik et al. |

FOREIGN PATENT DOCUMENTS

| | | |
|---|---|---|
| EP | 1 630 860 A3 | 3/2006 |
| JP | 54087075 | 7/1979 |
| RU | 2 402 103 C1 | 10/2010 |
| WO | WO 2016/050879 A1 | 4/2016 |

OTHER PUBLICATIONS

Rao et al., "Microstructural and Compositional Characterisation of Electronic Materials;" Review Article in Defence Science Journal, vol. 66, No. 4; Jul. 2016; pp. 341-352; 12 Pages.

Taiwan Office Action with English Translation including Search Report, Application No. 109127891, dated Mar. 25, 2021, 14 pages.

Notification of Transmittal of the International Search Report and the Written Opinion of the ISA dated Oct. 28, 2020 for International Application No. PCT/US2020/044707; 1 Page.

International Search Report dated Oct. 28, 2020 for International Application No. PCT/US2020/044707; 5 Pages.

Written Opinion of the ISA dated Oct. 28, 2020 for International Application No. PCT/US2020/044707; 13 Pages.

\* cited by examiner

OHMIC ALLOY CONTACT REGION SEALING LAYER

TECHNICAL FIELD

This disclosure relates generally to ohmic contacts on semiconductor devices.

BACKGROUND OF THE INVENTION

As is known in the art, ohmic contacts are used in many integrated circuit applications. One such application is in the formation of a Field Effect transistor (FET) including a semiconductor having source and drain contacts and a gate contact disposed between the source contact and the drain contact; the gate contact controls a flow of carriers through the semiconductor between the source contact and the drain contact. FETs require good, i.e., low resistance ohmic contacts to the semiconductor in order to reduce unwanted voltage drops and unwanted power dissipation. More particularly, a good ohmic contact requires the metal used for the source and drain contacts to alloy into the semiconductor surface and create a region of high doping and low resistance.

For Gallium Arsenide (GaAs) FETs, nickel has been used as a bottom layer of the source and drain contact and the nickel diffuses into the GaAs semiconductor during a high temperature alloy step. After alloying, however, the nickel (Ni) can form an oxide that will leach out of the ohmic contacts during subsequent wet chemistry steps used in the FET fabrication. More particularly, in many FETs, the source and drain contacts are formed in ohmic contact with a relative high doped semiconductor layer, while the gate is formed in Schottky contact with a region of lower doped or undoped semiconductor layer disposed under the relatively high doped semiconductor layer; such Schottky contact region being exposed by a notch etched through the upper semiconductor layer to expose the gate contact region on the lower semiconductor layer. In the case of a Gallium Arsenide (GaAs) semiconductor based material, one component of the etchant used to form the notch is an oxidizer such as hydrogen peroxide which, when in contact with source and drain ohmic contact regions can cause the unwanted leaching of the Ni. "Ohmic Ooze" is the formation of a nickel oxide phase which erupts into the gate channel along the edge of the ohmic where the NiGeAs phase is exposed to process chemistries prior to the dielectric passivation deposition step. This leached or oozing Ni metal can cause short circuits that adversely affect yield and reliability of the FET if it is sufficiently severe. More particularly, any exposed Ni or Ni containing alloy at the surface or along the edge of the ohmic contact is susceptible to oxidation in subsequent process steps until the ohmic contacts have been passivated. Standard passivation methods such as the use of dielectric passivation layers are typically deposited only after a Schottky gate contact is completed in order to prevent any impact of the etching of the passivation on the formation of the Schottky gate contact.

SUMMARY OF THE INVENTION

In accordance with the present disclosure, a method is provided comprising: depositing an ohmic contact sealing layer disposed at an intersection between a sidewall of an ohmic contact and a surface of a semiconductor; and subjecting the semiconductor with the ohmic contact to a wet chemistry.

In one embodiment, the ohmic contact sealing layer is polycrystalline, amorphous dielectric.

In one embodiment, the ohmic contact sealing material comprises metal.

In one embodiment the wet chemistry is an etchant.

In one embodiment, a Field Effect Transistor (FET) is provided comprising: a semiconductor, and an ohmic contact sealing layer disposed at an intersection between a sidewall of an ohmic contact and a surface of a semiconductor, such ohmic contact sealing layer being a non-single crystal material.

In one embodiment, a method is provided for forming a Field effect Transistor, comprising: depositing an ohmic contact sealing layer disposed at: (a) an intersection between a sidewall of a source contact and a surface of a semiconductor; and (b) an intersection between a sidewall of the drain contact and the surface of the semiconductor; forming a notch in the surface of the semiconductor between the source contact and the drain contact; and forming a gate contact in the notch, such gate contact being in contact with the semiconductor.

In one embodiment, the method includes forming a passivation layer over the ohmic contact sealing layer.

In one embodiment, the gate contact and the ohmic contact sealing layer comprise the same metal.

In one embodiment, the ohmic contact sealing layer is formed before forming the notch.

In one embodiment, the ohmic contact sealing layer is formed subsequent to forming the notch.

In one embodiment, a method is provided for forming a Field Effect Transistor (FET), comprising forming a material over a source ohmic contact metal and over a drain ohmic contact metal, such material comprising portions of a gate Schottky contact metal.

In one embodiment, the source contact and the drain contact comprise nickel.

In one embodiment, the FET comprises Gallium Arsenide.

In one embodiment, the material is an oxidation retardation material to retard oxidation of the source ohmic contact metal and the drain ohmic contact metal.

In one embodiment, the material retards leaching of the ohmic contact metal during processing subsequent to the forming of the ohmic contact metal.

In one embodiment, a Field Effect Transistor (FET) is provided comprising: a semiconductor, a source contact in ohmic contact with a first portion of a surface of the semiconductor; a drain contact in ohmic contact with a second portion of the surface of the semiconductor; a gate contact, disposed between the source contact and the drain contact, comprising a ohmic contact sealing, gate metal having a first portion disposed in Schottky contact with a third portion of the surface of the semiconductor, such third portion of the surface of the semiconductor being laterally spaced from both the first portion and the second portion of the surface of the semiconductor; wherein the ohmic contact sealing, gate metal has a second portion disposed at an intersection of a sidewall of the source contact and the first portion of the surface of the semiconductor; wherein the ohmic contact sealing, gate metal has a third portion disposed at an intersection between a sidewall of the drain contact and the second portion of the surface of the semiconductor, and wherein the second portion of the ohmic contact sealing, gate metal and the third portion of the ohmic contact sealing, gate metal are laterally spaced from the first portion of the gate metal.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 1:
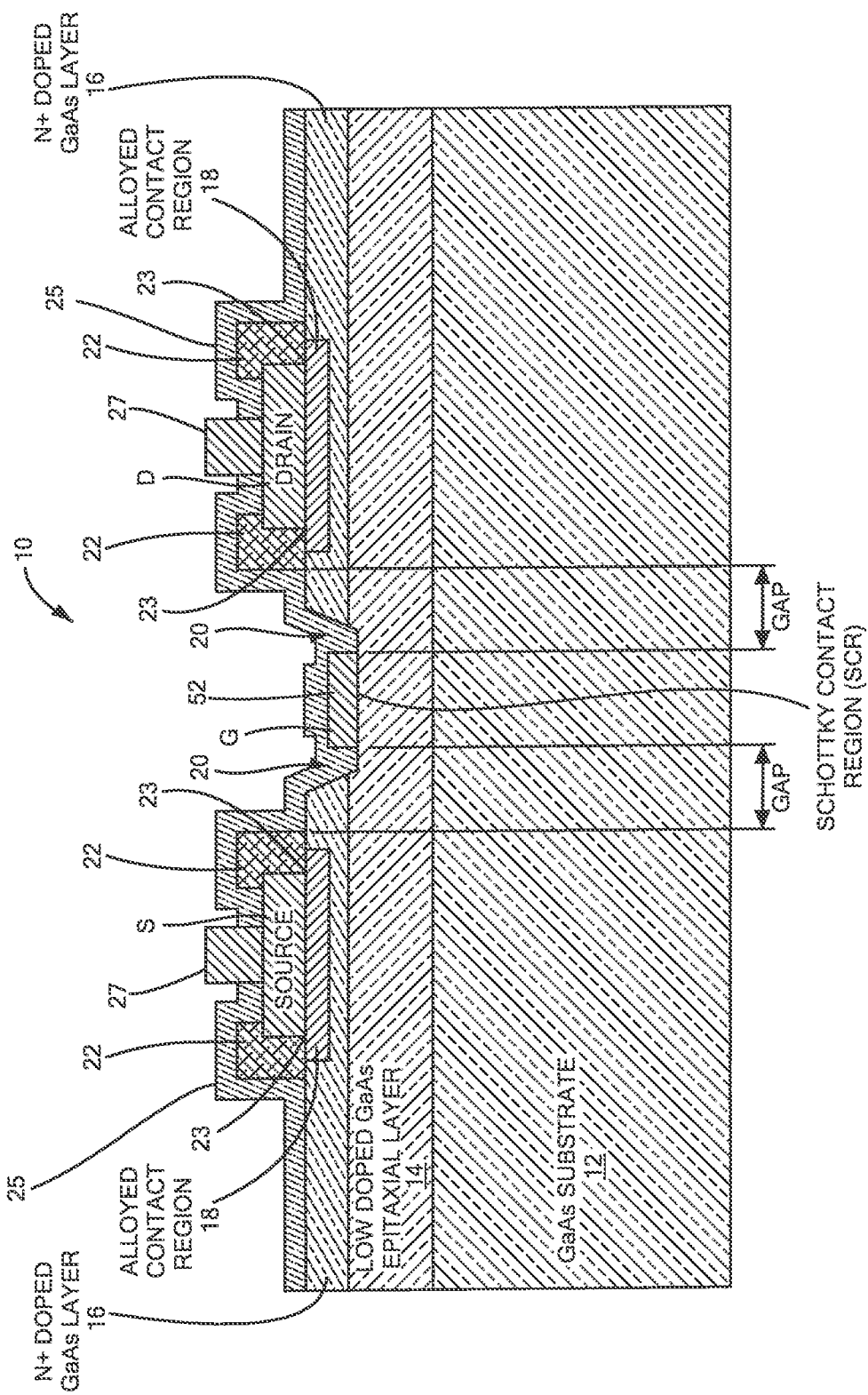
FIG. 1 is a simplified, diagrammatical, cross-sectional sketch of a Field Effect Transistor according to the disclosure.

Referring now to FIG. 1 a Field Effect Transistor (FET) 10 as show having a Gallium Arsenide (GaAs) substrate 12, a low doped or undoped GaAs epitaxial layer 14 on the upper surface of the substrate 12, and a doped, here, for example, N+ doped (for example, Silicon doped) GaAs layer 16. Source S and Drain D contact are formed on respective portions of the upper surface of the N+ doped layer 16 in a manner to be described. Suffice it to say here that source and drain metals, here for example Ni, Ge and Au, are alloyed using time and temperature in heating the structure into the respective portions of the upper surface of the N+ doped GaAs layer 16 to form alloyed ohmic contact regions 18, as shown. A Gate, G, is formed in Schottky contact with an upper portion of the undoped GaAs epitaxial layer 14 (i.e., a SCHOTTKY CONTACT REGION); it being noted that the Gate contact G passes through a notch 20 formed in a portion of the N+ doped GaAs layer 16 and which notch 20 terminates in the undoped GaAs epitaxial layer 14, as shown. It is noted that an ohmic contact sealing layer 22, to be described in detail below, is disposed as a continuous material on portions of: upper portions of the source S and drain D contacts; sidewalls of the source S and drain D contacts; and then onto portions of the alloyed ohmic contact regions 18 including the interface 23 between the source S and drain D contacts and the N alloyed ohmic contact regions 18 as shown. Here, for example the ohmic contact sealing layer is a dielectric, here for example, silicon oxide or silicon nitride. It is noted that the sealing layer 22 may be a metal, such as for example Ti, Pt and Au. It is further noted that there are gaps (GAP) between the ohmic contact sealing layer 22 and the gate contact G, as shown. Conventional passivation/classifications layers 25 and electrodes 27 are provided as shown.

Figure 2A:
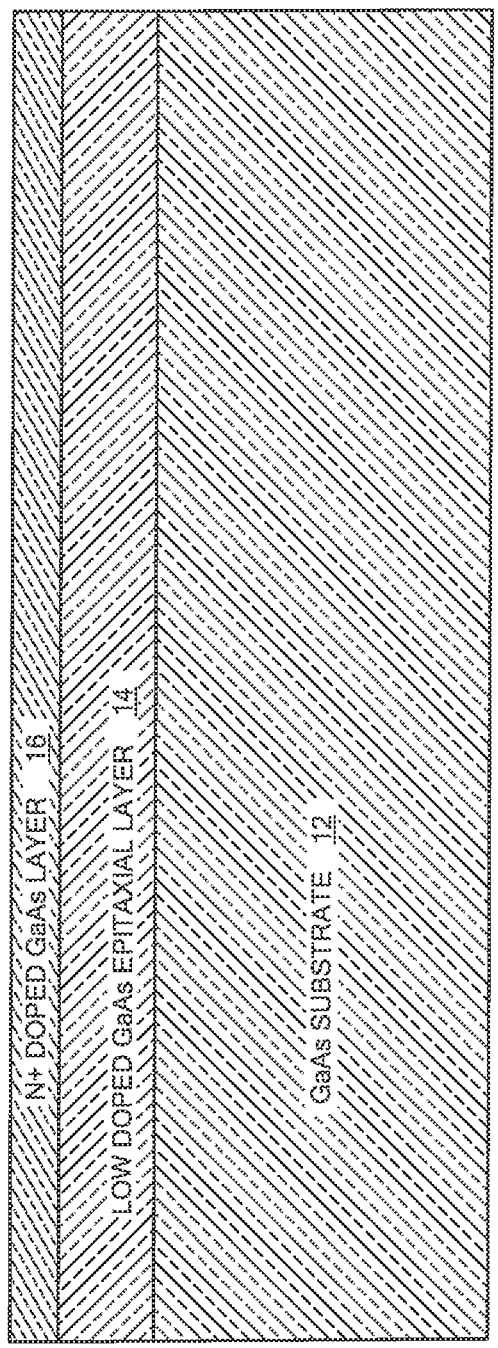
FIGS. 2A-2J are simplified, diagrammatical, cross-sectional sketches of steps used to form the Field Effect Transistor of FIG. 1 according to the disclosure.
Figure 2B:
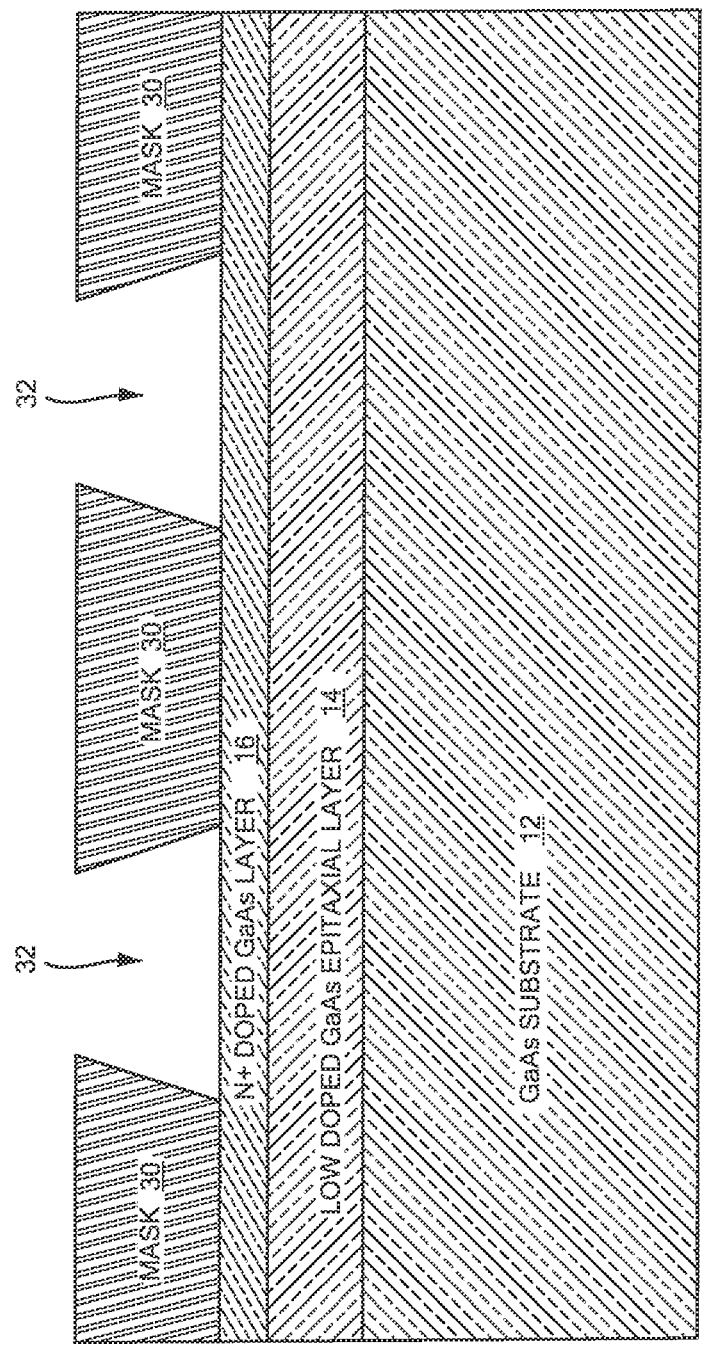

Referring now to FIGS. 2A and 2B, the Gallium Arsenide (GaAs) substrate 12, the low doped or undoped GaAs epitaxial layer 14 on the upper surface of the substrate 12, and the doped, here, for example, N+ doped GaAs layer 16 are provided as shown in FIG. 2A and a mask 30 is formed and patterned over the surface with windows or openings 32 as shown in FIG. 2B.

Figure 2C:
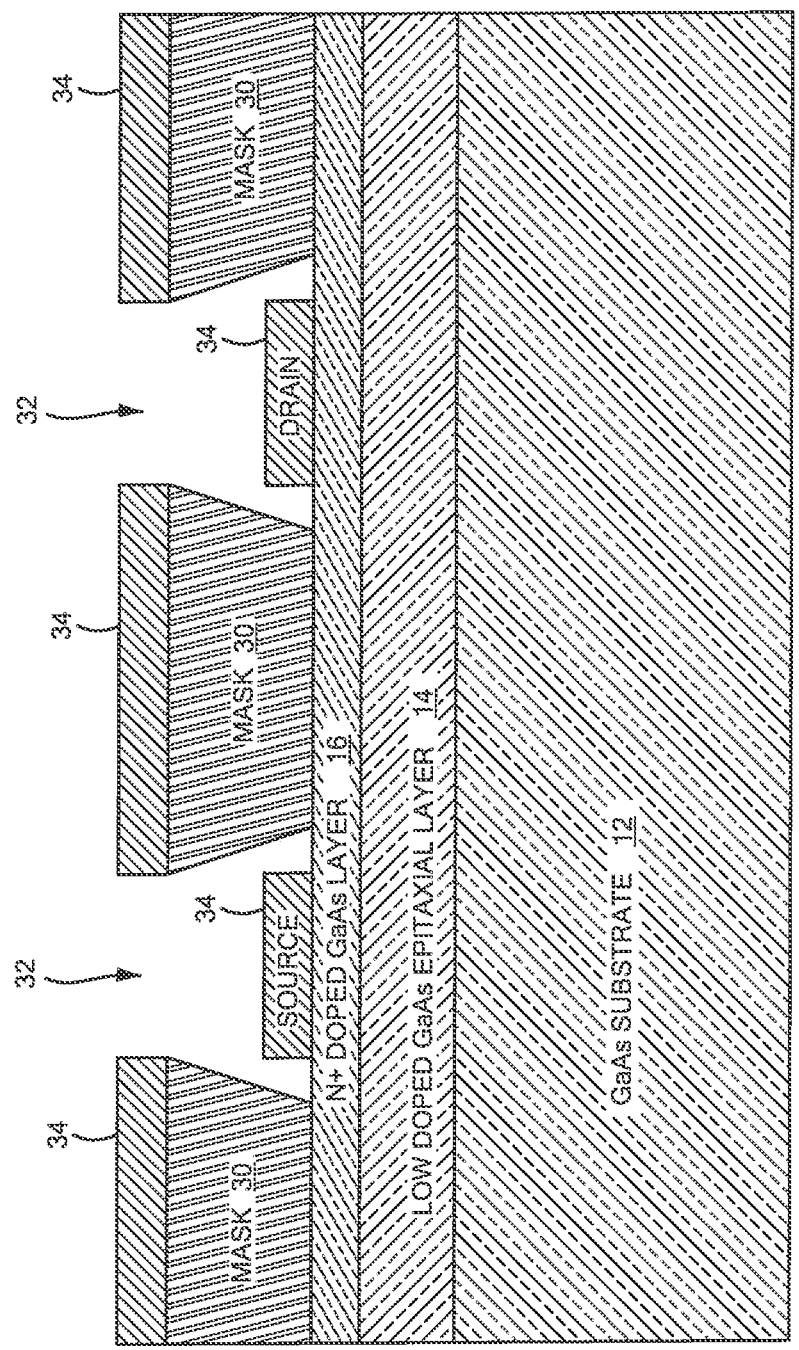

Referring to FIG. 2C, layer 34 of metal, here for example Ni, Ge and Au deposited sequentially by evaporation over the surface, as shown; it being noted that portions of the layer 34 of metal passes through windows 32 formed in the mask 30 onto exposed portions of the surface of the N+ doped GaAs layer 16, as shown.

Figure 2D:
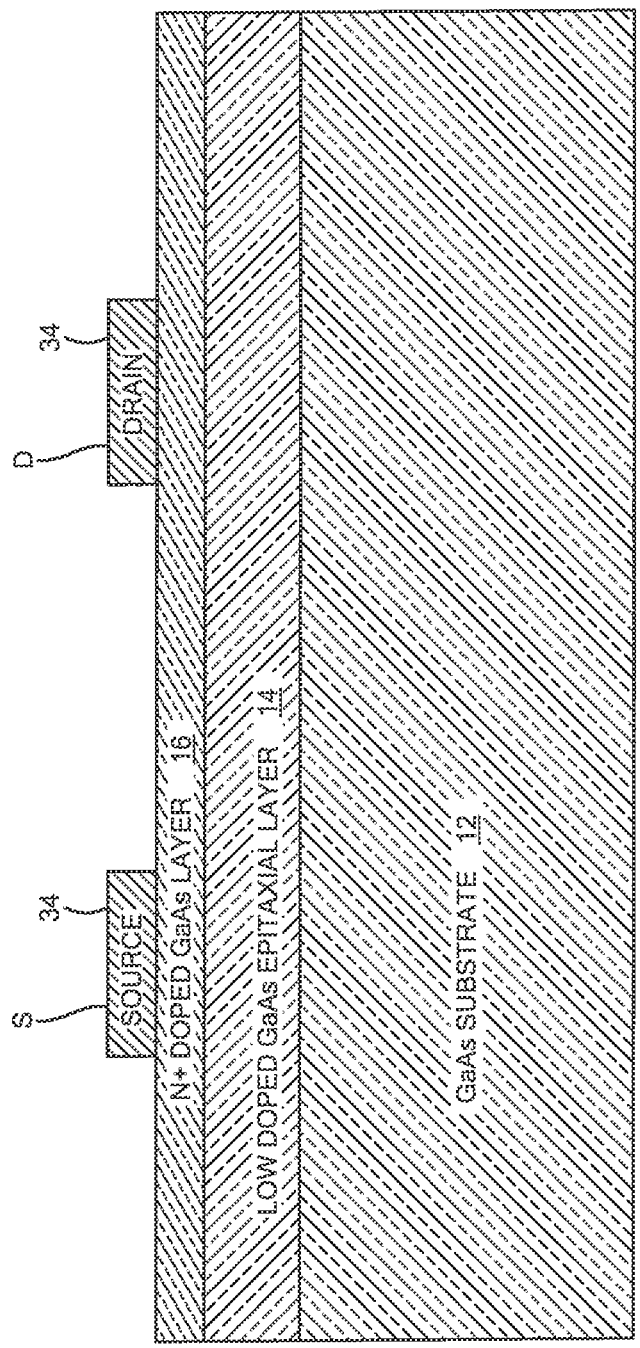

Referring now to FIG. 2D, the mask 30 (FIG. 2C) is lifted off leaving the portion of the metal layer 34 on the previously exposed portions of the surface of the N+ doped GaAs layer 16, as shown, forming the source S and drain D contacts, as shown.

Figure 2E:
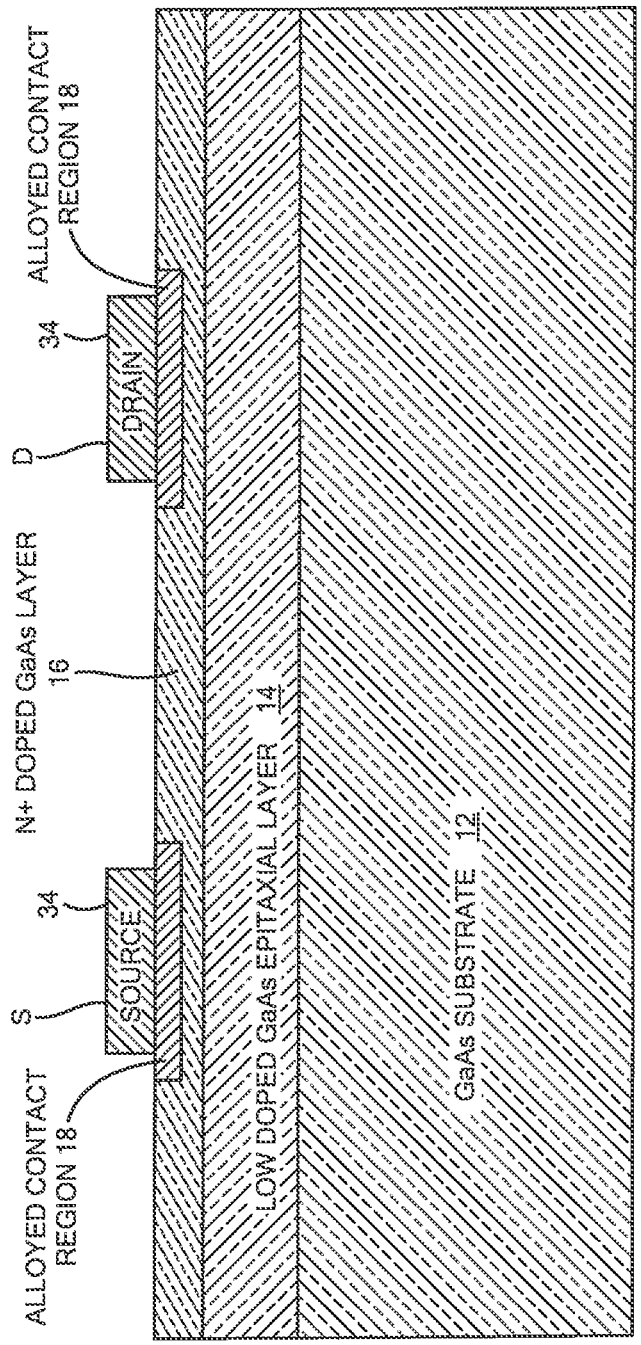

Referring now to FIG. 2E the structure subjected to heating in a temperature range, in this example, from 400-425 degrees Centigrade, for in this example 30-60 seconds, to alloy the metal 34 with the underlying portions of the previously exposed portions of the surface of the N+ doped GaAs layer to form the alloyed ohmic contact regions 18 comprising Gallium, Arsenic, Nickel, Germanium and Gold alloy phases in the N+ doped GaAs layer, as shown. It is noted that the alloying process results in spreading of the alloyed ohmic contact regions 18 laterally beyond sidewalls the source S and Drain D contacts, as shown.

Figure 2F:
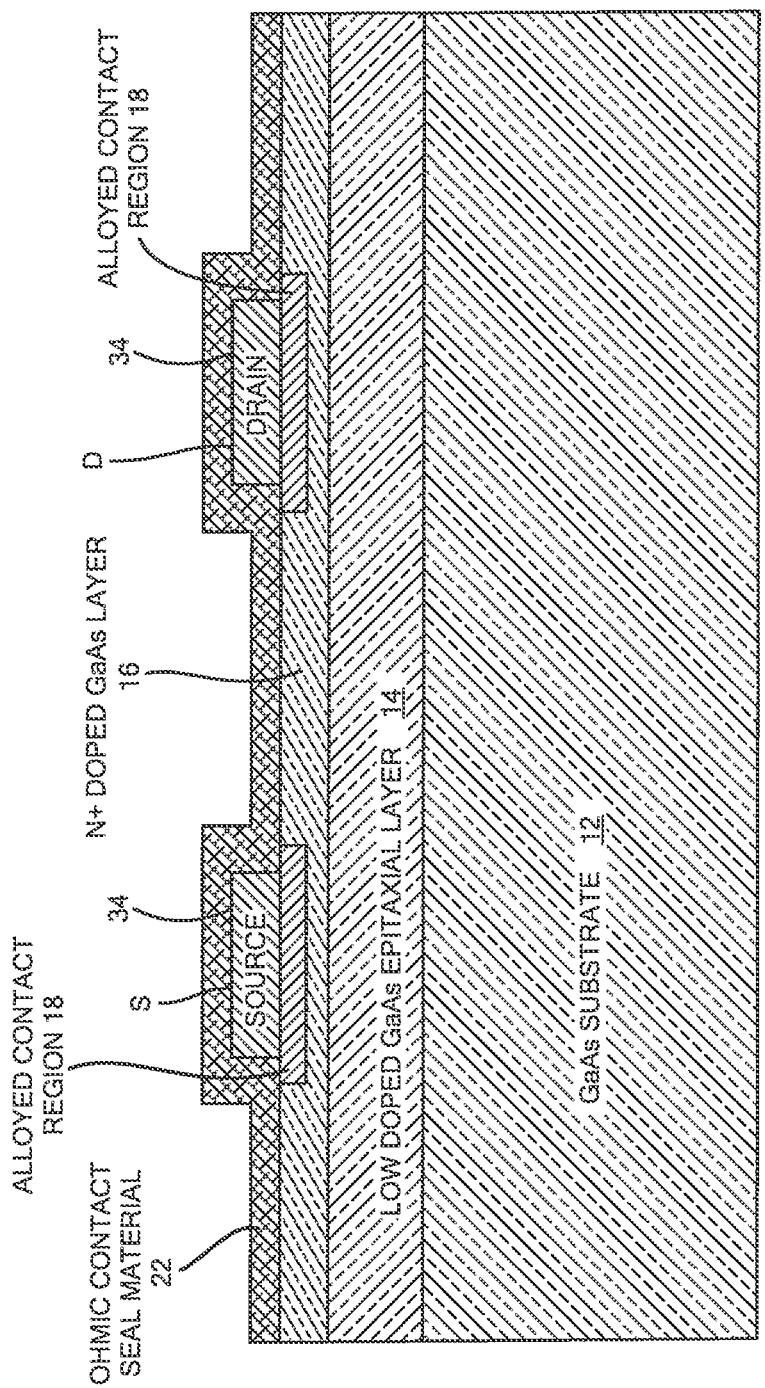

Referring now to FIG. 2F, the ohmic contact sealing layer 22 is deposited over the entire surface of the structure as shown. More particularly, here a dielectric seal is formed by depositing a continuous dielectric film over the entire wafer surface, for example silicon dioxide SiO2 deposited by Atomic Layer Deposition (ALD).

Figure 2G:
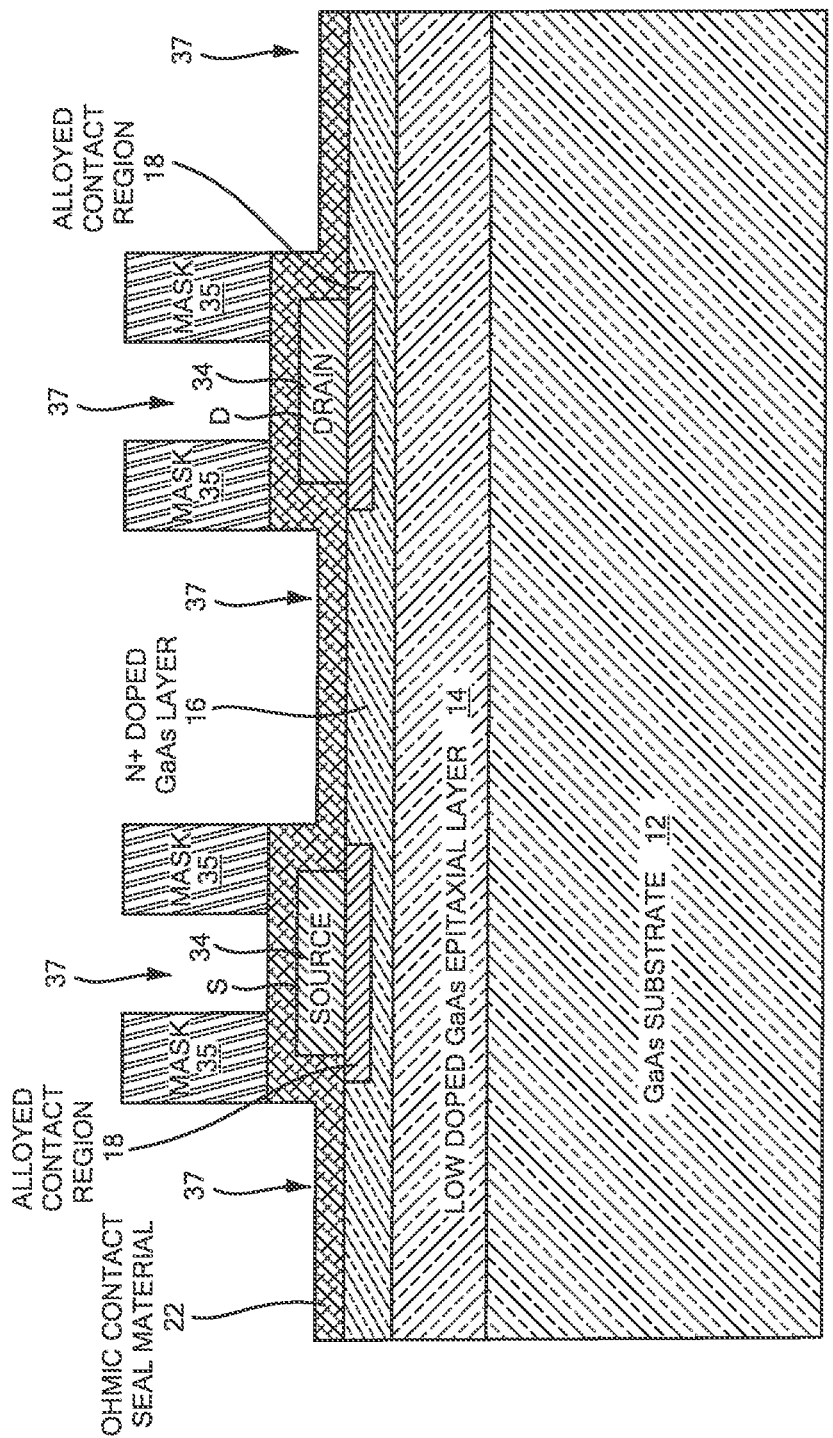
Figure 2H:
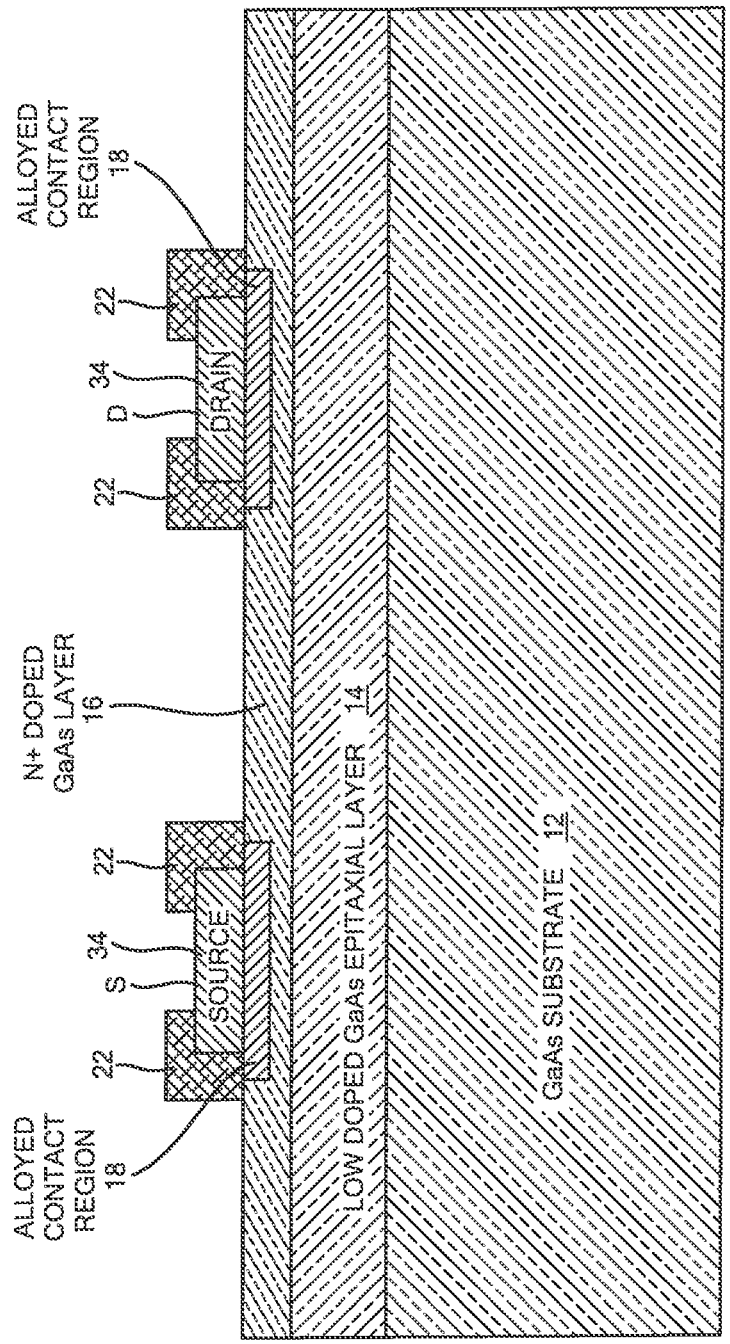

Referring to FIG. 2G, a photoresist mask 35 is formed over the ohmic contact sealing layer 22, such mask 35 having widows 37 as shown. An etchant, here for example hydrofluoric acid, is brought into contact with the masked surface removing the portions of the ohmic contact sealing layer 22 exposed by the windows 37 to produce, after stripping off mask 35, the structure shown in FIG. 2H.

Figure 2I:
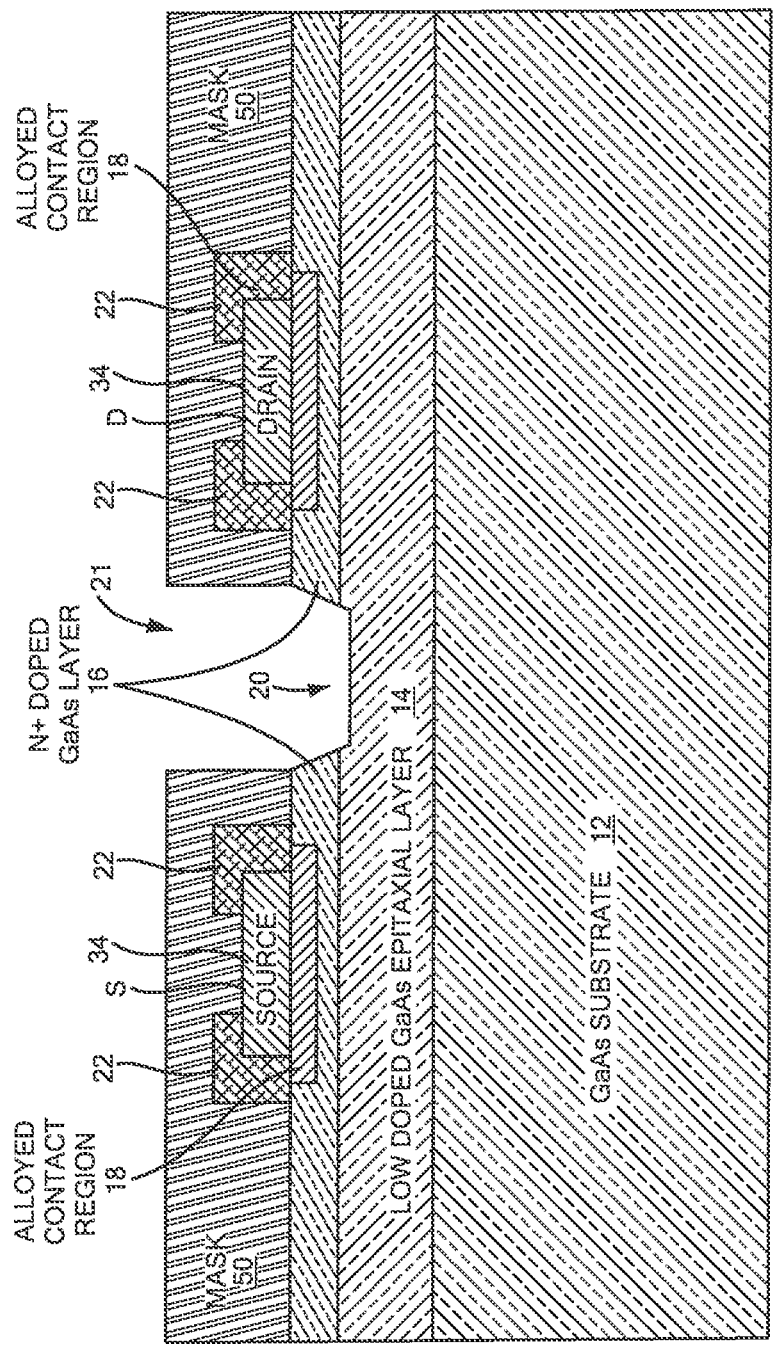

Referring to FIG. 2I, a mask 50 is formed over the structure having a window 21 over the upper surface of the structure where the notch 20 is to be formed, as shown. The notch 20 (FIG. 1) is formed as shown in FIG. 2I, using a suitable wet chemical etchant, here for example citric acid. It is noted that the sealing layer 22 prevents oozing of Ni in the Source S and drain D contacts from the alloyed contact regions 18.

Figure 2J:
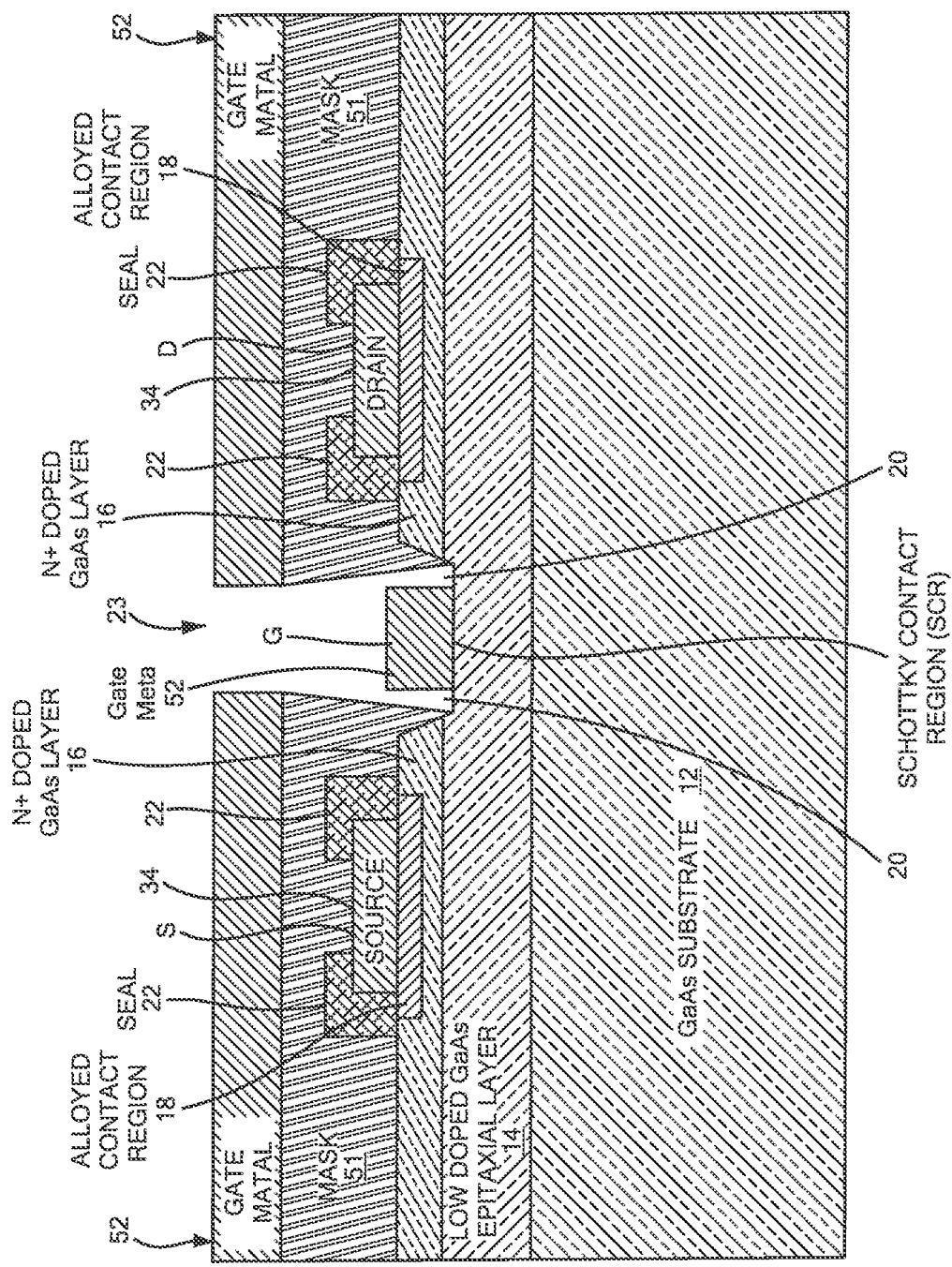

After the mask 50 is removed, a new mask 51, as shown in FIG. 2J is formed having a window 23 formed therein over the notch 20, as shown. A gate metal 52 is deposited over the mask 51 and through the window 23 in the photoresist 51 onto a portion of the surface of the notch 20 exposed by the window 23, as shown in FIG. 2J.

The mask 51 is lifted off thereby removing the metal 52 thereon but leaving the portion of the gate metal 52 in the notch 20 to form the gate contact G in Schottky contact with the SCHOTTKY CONTACT REGION (SCR). Conventional passivation/glassification layer 25 and contact metal layer 27 are then provided in any conventional manner to produce the FET 10 as shown in FIG. 1.

Is should be understood that the dielectric seal layer under other portions of a MMIC circuit besides the FETs can be left to provide early passivation.

Figure 3:
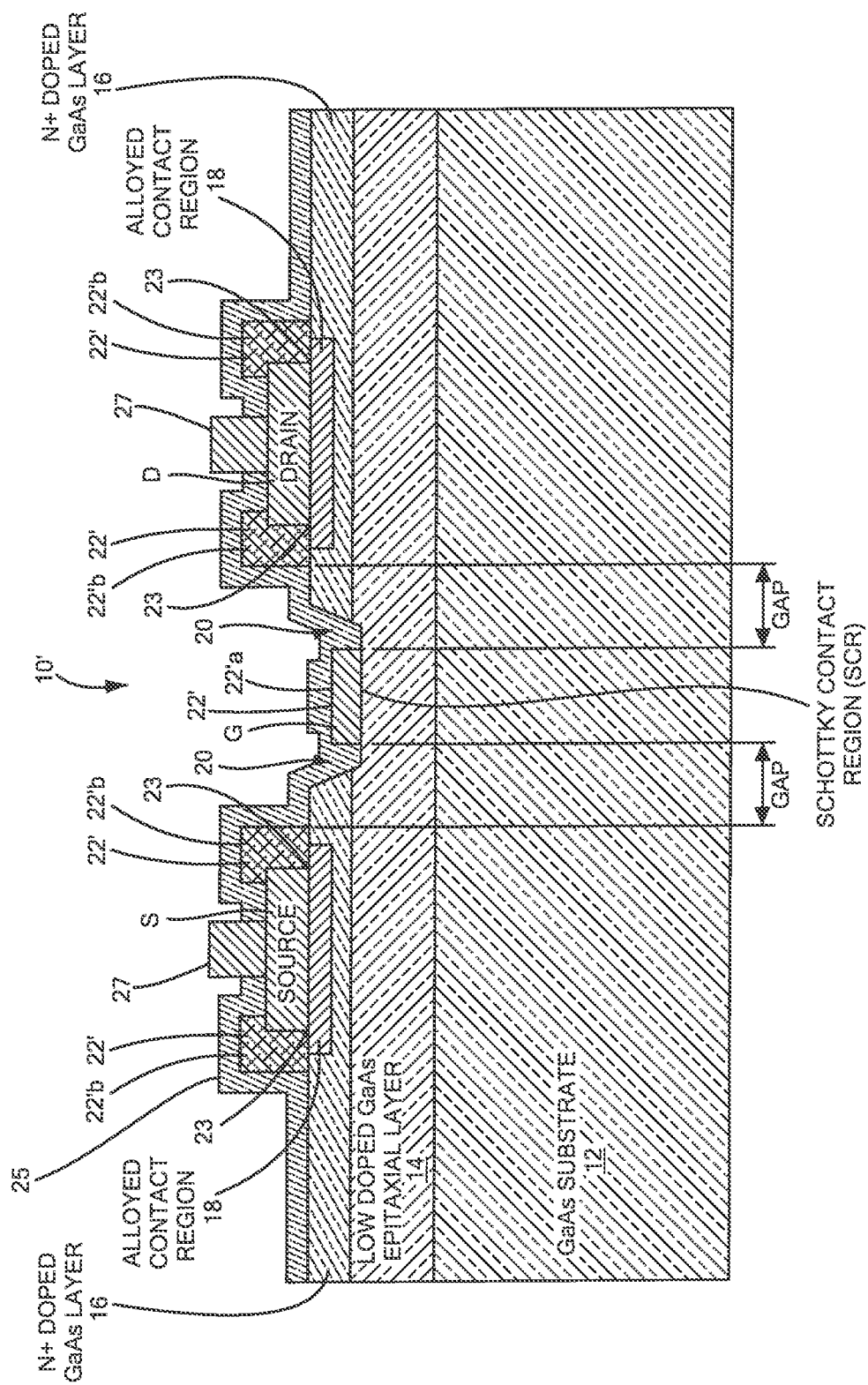
FIG. 3 is a simplified, diagrammatical, cross-sectional sketch of a Field Effect Transistor according to an alternative embodiment of the disclosure.

Referring now to FIG. 3, a Field Effect Transistor (FET) 10' is show having a Gallium Arsenide (GaAs) substrate 12, a low doped or undoped GaAs epitaxial layer 14 on the upper surface of the substrate 12, and a doped, here, for example, N+ doped (for example, Silicon doped) GaAs layer 16. Source S and Drain D contact are formed on respective portions of the upper surface of the N+ doped layer 16 in a manner to be described. Suffice it to say here that source and drain metals, here for example Ni, Ge and Au, are alloyed using time and temperature in heating the structure into the respective portions of the upper surface of the N+ doped GaAs layer 16 to form alloyed ohmic contact regions 18, as shown.

A Gate, G, contact is formed in Schottky contact with an upper portion of the undoped GaAs epitaxial layer 14 SCHOTTKY CONTACT REGION (SCR); it being noted that the Gate contact passes through a notch 20 formed in a portion of the N+ doped GaAs layer 16 and which notch 20 terminates in the undoped GaAs epitaxial layer 14, as shown. It is noted that an ohmic contact sealing layer/ Schottky contact material 22', to be described in detail below, is disposed as a continuous material on portions on: upper portions 22'b of the source S and drain D contacts; sidewalls of the source S and drain D contacts; and then onto portions of the alloyed ohmic contact regions 18 including the interface 23 between the source S and drain D contacts and the N alloyed ohmic contact regions 18 as shown. As will be described below, a portion 22'a of the ohmic contact sealing layer/Schottky contact material 22' is used for the gate contact G. Ohmic contact seal 22'b and gate contact 22'a are formed of the same material 22' and they are formed on the FET 10' at the same processing step. Here, for example the ohmic contact sealing layer/Schottky contact material 22' material is Ti, Pt and Au. It is noted that there is are gaps (GAP) between the portion 22'a of the ohmic contact sealing layer/Schottky contact material 22' and the portion 22'b of ohmic contact sealing layer/Schottky contact material 22', as shown. Conventional passivation/glassification layers 25 and electrodes 27 are provided as shown.

Figure 4A:
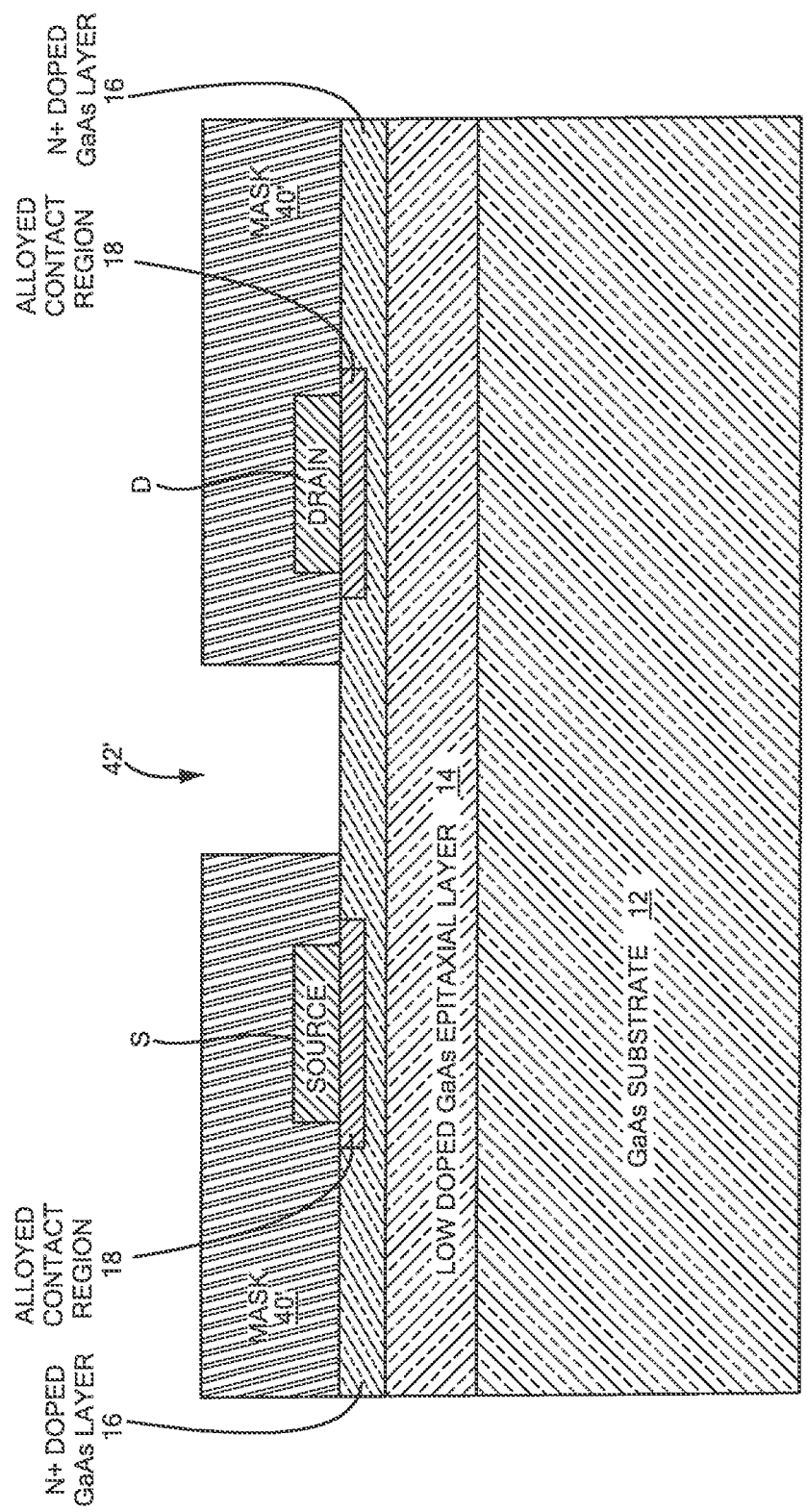
FIGS. 4A-4D are simplified, diagrammatical, cross-sectional sketches of steps used to form the Field Effect Transistor of FIG. 3 according to the alternative embodiment of the disclosure.
Figure 4B:
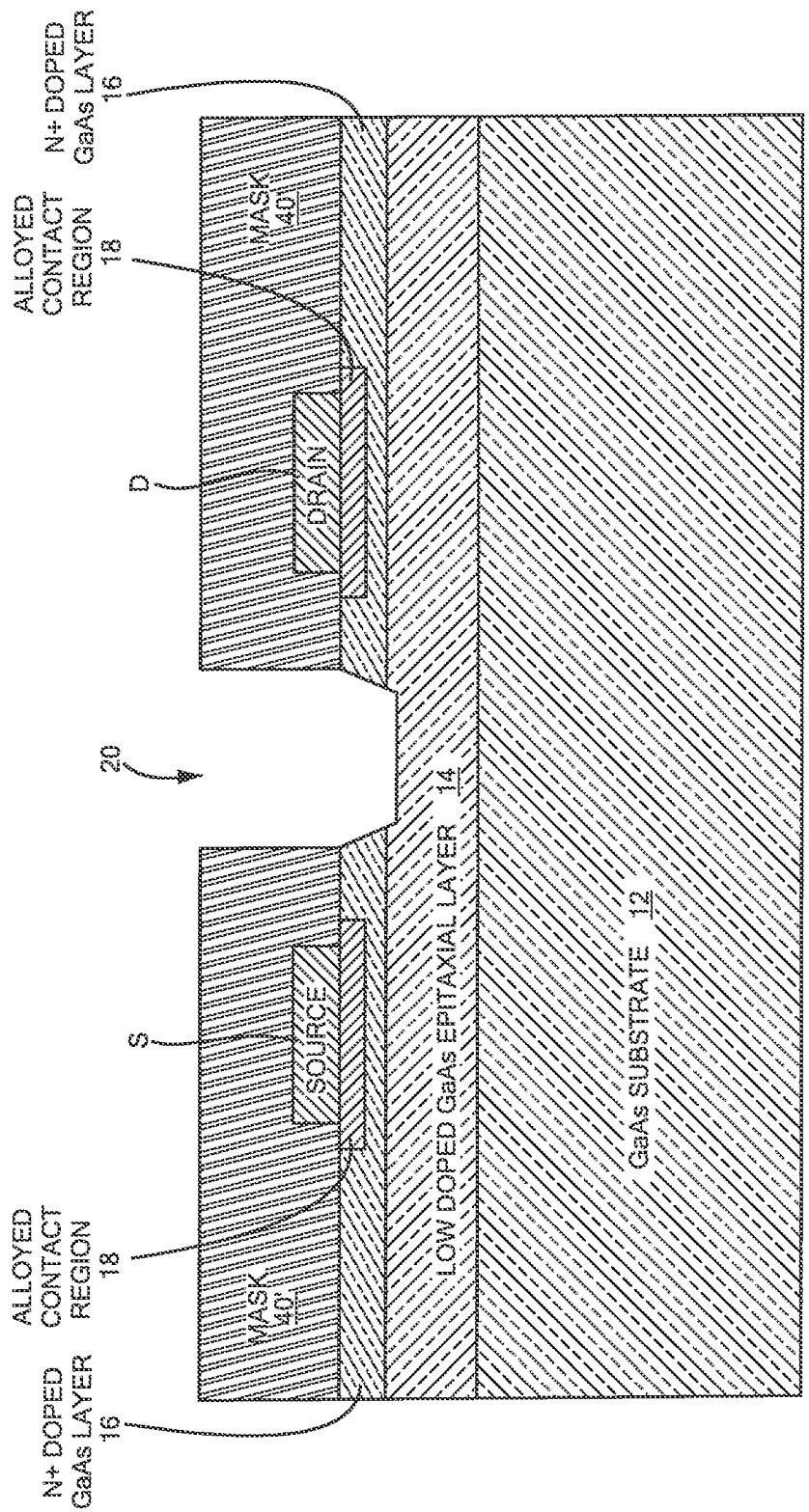
Figure 4C:
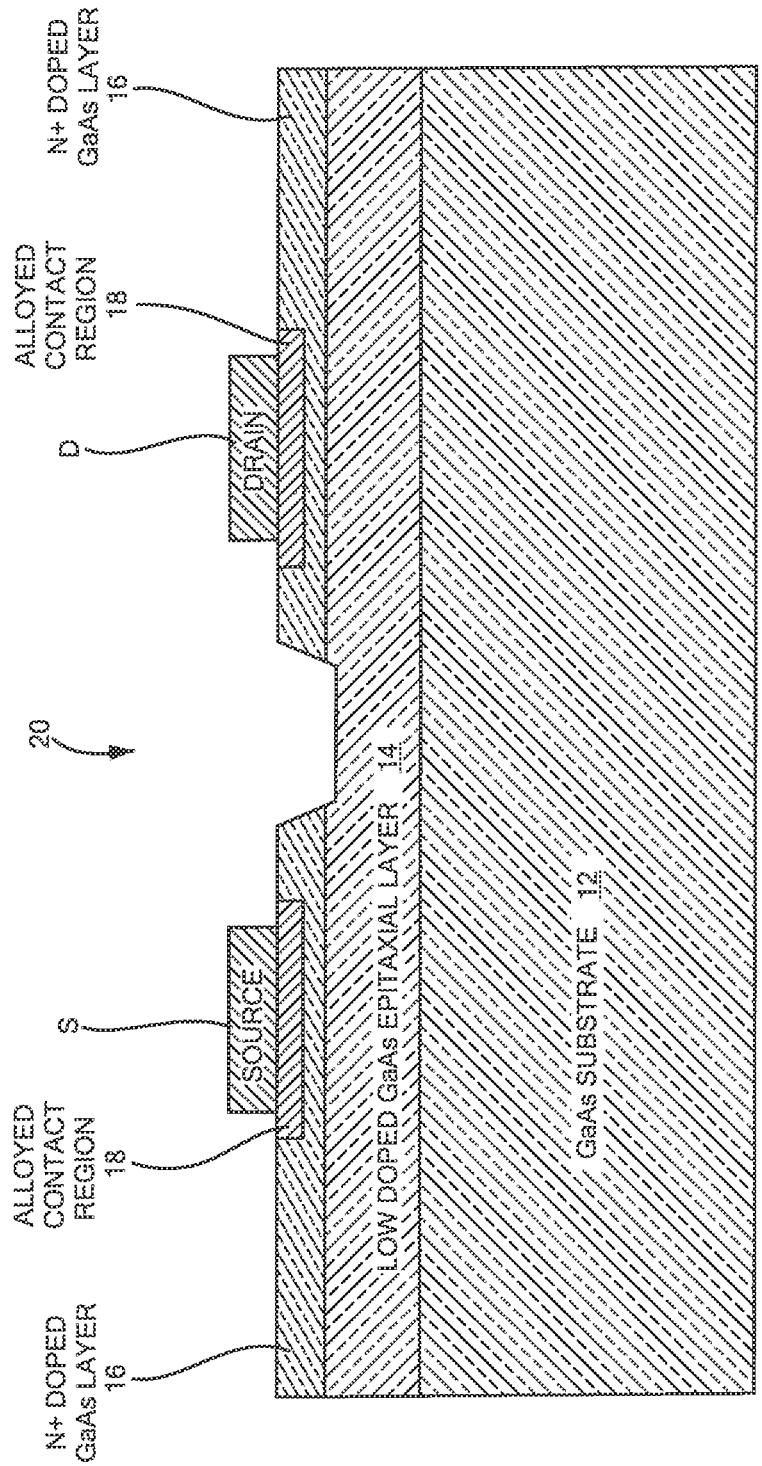

Referring now to FIG. 4A, in this embodiment, after forming the structure shown in FIG. 2E: A mask 40' is formed over the upper surface having a window 42' to expose a portion of layer 16 where a notch 20 is to be formed, as shown. The notch 20 (FIG. 4B) is formed as shown in FIG. 4B, using a suitable wet chemical etchant, here for example citric acid; and the mask 40' is removed, as shown in FIG. 4C.

Figure 4D:
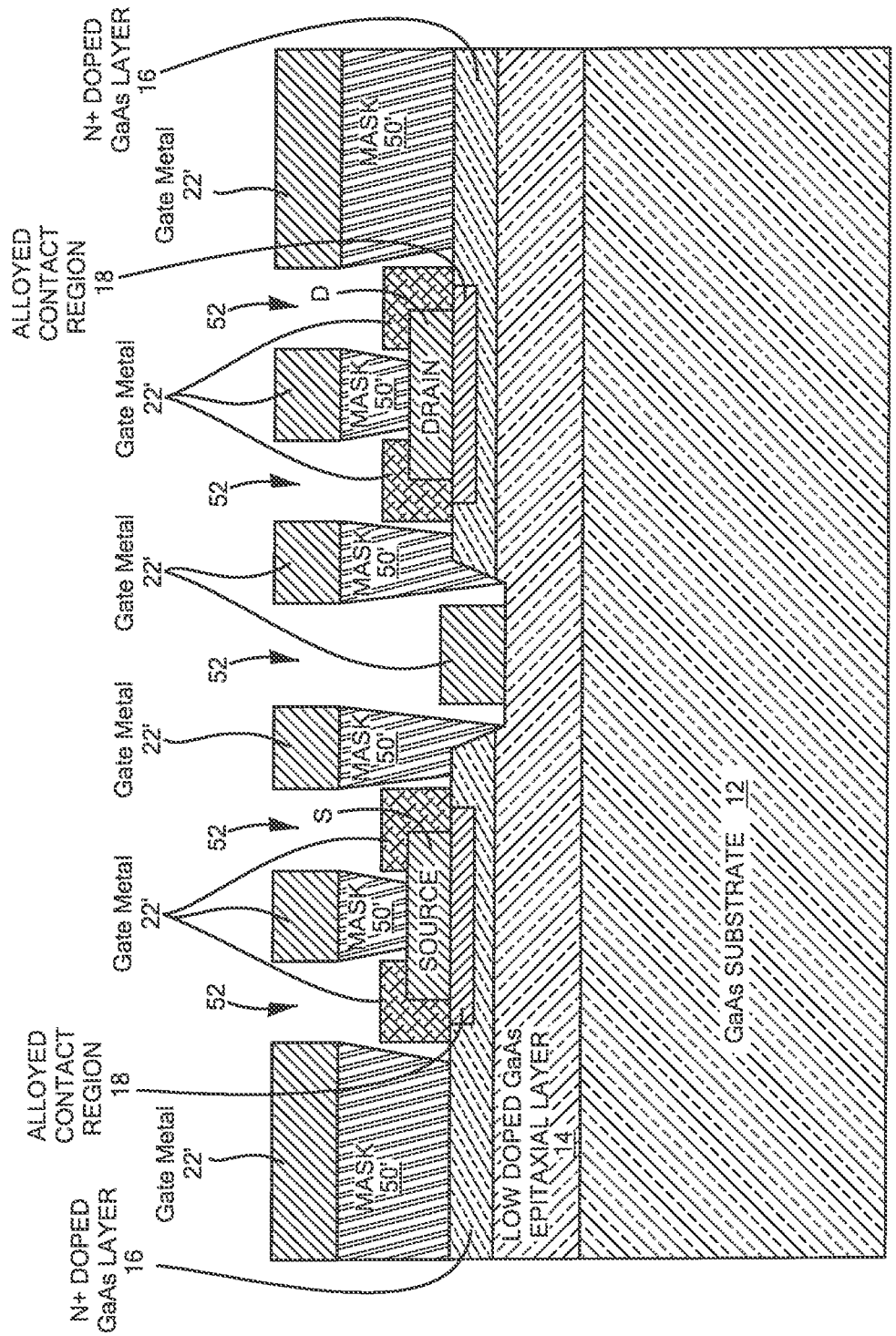

Referring to FIG. 4D, a mask 50' is formed over the structure as shown; and the ohmic contact sealing layer/ Schottky contact material 22', here for example Ti, Pt and Au deposited by evaporation, passes through windows 52 in the mask 50', as shown. After the mask 50' is lifted off, the FET 10' is thereby formed as shown in FIG. 3. These steps simultaneously form: the Schottky contact for the Gate electrode G 22'a (FIG. 3) between the ohmic contact sealing layer/Schottky contact material 22' and the low doped GaAs layer 14; and another portion of the ohmic contact sealing layer/Schottky contact material 22', the portion 22b' (FIG. 3): on the source and drain contacts S and D; on the alloyed regions 18; and on the N+ doped GaAs layer 16; it being noted that portion 22'b is in contact with the alloyed regions 18 and on the N+ doped GaAs layer 16. The portion 22'b is an oxidation retardation material to retard oxidation of the source ohmic contact metal and the drain ohmic contact metal, thereby retarding leaching of the ohmic contact metal during processing steps that are subsequent to the formation of the ohmic contact metal. Conventional passivation/glassification layers 25 and electrodes 27 (FIG. 3) are formed, as shown.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A Field Effect Transistor (FET) comprising:
   a source contact in ohmic contact with a surface of an upper semiconductor layer;
   a drain contact in ohmic contact with the surface of the upper semiconductor layer;
      wherein the upper semiconductor layer has a notch in the surface of the semiconductor layer between the source contact and the drain contact, the notch terminating in a lower semiconductor layer;
   a gate contact disposed in the notch and in contact with the lower semiconductor layer; and
   an ohmic contact sealing layer disposed at: (a) an intersection between a sidewall of the source contact and the surface of the upper semiconductor layer; and (b) an intersection between a sidewall of the drain contact and the surface of the upper semiconductor layer;
   wherein the ohmic contact sealing layer is spaced from the gate contact by a gap in the ohmic contact sealing layer between the source contact and the gate contact and a gap between the drain contact and the gate contact; and
   wherein the ohmic contact sealing layer comprises a non-single crystal material.

2. The FET recited in claim 1 wherein the ohmic contact sealing layer is solid dielectric.

3. The FET recited in claim 1 wherein the ohmic contact sealing layer is metal.

4. The FET recited in claim 1 wherein a portion of the metal is disposed on the source contact and the upper semiconductor layer, a portion of the metal is disposed on the drain contact and the upper semiconductor layer, and the gate contact comprises a third portion of the metal.

5. The FET recited in claim 4 wherein the third portion of the metal is in Schottky contact with the lower semiconductor layer.

6. The Field Effect Transistor (FET) recited in claim 4 wherein the second portion and the third portion of the ohmic contact sealing, gate metal retard oxidation of the source contact at the intersection between the sidewall of the source contact and the first portion of the surface of the semiconductor and retard oxidation of the of the drain contact at the an intersection between the sidewall of the drain contact and the second portion of the surface of the semiconductor.

7. The FET recited in claim 6 wherein the third portion of the surface of the semiconductor is recessed below the first portion of the surface of the semiconductor and the second portion of the surface of the semiconductor.

8. The FET recited in claim 6 wherein the source contact and the drain contact comprises nickel.

9. The FET recited in claim 8 wherein the semiconductor comprises Gallium Arsenide.

10. A Field Effect Transistor (FET), comprising:
   a semiconductor;
   a source contact in ohmic contact with a first portion of a surface of the semiconductor;
   a drain contact in ohmic contact with a second portion of the surface of the semiconductor;
   a gate contact, disposed between the source contact and the drain contact, comprising a ohmic contact sealing, gate metal having a first portion disposed in Schottky contact with a third portion of the surface of the semiconductor, such third portion of the surface of the semiconductor being laterally spaced from both the first portion and the second portion of the surface of the semiconductor;

wherein the ohmic contact sealing, gate metal has a second portion disposed at an intersection of a sidewall of the source contact and the first portion of the surface of the semiconductor;

wherein the ohmic contact sealing, gate metal has a third portion disposed at an intersection between a sidewall of the drain contact and the second portion of the surface of the semiconductor; and wherein the second portion of the ohmic contact sealing, gate metal and the third portion of the ohmic contact sealing, gate metal are laterally spaced from the first portion of the gate metal.

11. The FET recited in claim 10 wherein the third portion of the surface of the semiconductor is recessed below the first portion of the surface of the semiconductor and the second portion of the surface of the semiconductor.

12. The FET recited in claim 11 wherein the source contact and drain contact comprise nickel.

13. The FET recited in claim 12 wherein the semiconductor comprises Gallium Arsenide.

* * * * *